(12) United States Patent
Peabody

(10) Patent No.: US 6,278,051 B1
(45) Date of Patent: Aug. 21, 2001

(54) DIFFERENTIAL THERMOPILE HEAT FLUX TRANSDUCER

(75) Inventor: Hume L. Peabody, Laurel, MD (US)

(73) Assignee: Vatell Corporation, Christiansburg, VA (US)

( * ) Notice: Subject to any disclaimer, the term of this patent is extended or adjusted under 35 U.S.C. 154(b) by 0 days.

(21) Appl. No.: 09/529,149

(22) PCT Filed: Oct. 9, 1997

(86) PCT No.: PCT/US97/18333

§ 371 Date: Apr. 7, 2000

§ 102(e) Date: Apr. 7, 2000

(87) PCT Pub. No.: WO99/19702

PCT Pub. Date: Apr. 22, 1999

(51) Int. Cl.[7] .................................................. H01L 35/28
(52) U.S. Cl. ........................... 136/225; 136/227; 374/30; 374/179
(58) Field of Search .................... 136/225, 227; 374/30, 179

(56) References Cited

U.S. PATENT DOCUMENTS

| 2,429,200 | 10/1947 | Bradley et al. | 171/95 |
| 4,717,786 | * 1/1988 | Thery et al. | 136/225 |
| 4,850,713 | * 7/1989 | Thery et al. | 374/30 |
| 5,393,351 | 2/1995 | Kinard et al. | 136/225 |

* cited by examiner

Primary Examiner—Kathryn Gorgos
Assistant Examiner—Thomas H Parsons
(74) Attorney, Agent, or Firm—Morgan & Finnegan LLP

(57) ABSTRACT

A thin sensor for heat flux and temperature, designed for adhesive attachment to a surface, is manufactured on a flexible insulated metallic substrate. The sensor exhibits a combination of high sensitivity for heat flux and low resistance to the flow of heat. These characteristics enable it to measure heat flux at surface boundaries with improved accuracy over conventional heat flux transducers because the temperature drop produced by the sensor is very small. The response by the sensor to radiation, convection and conduction are equal. As such, the sensor can be calibrated in one mode of heat transfer and used for measurement in other modes. The high sensitivity of the sensor makes it ideal for measuring heat flow through insulating materials, and well adapted to instrumenting heat flow in buildings, detecting fires at an early stage, or remotely measuring the temperature of string and web products in industrial processing.

24 Claims, 10 Drawing Sheets

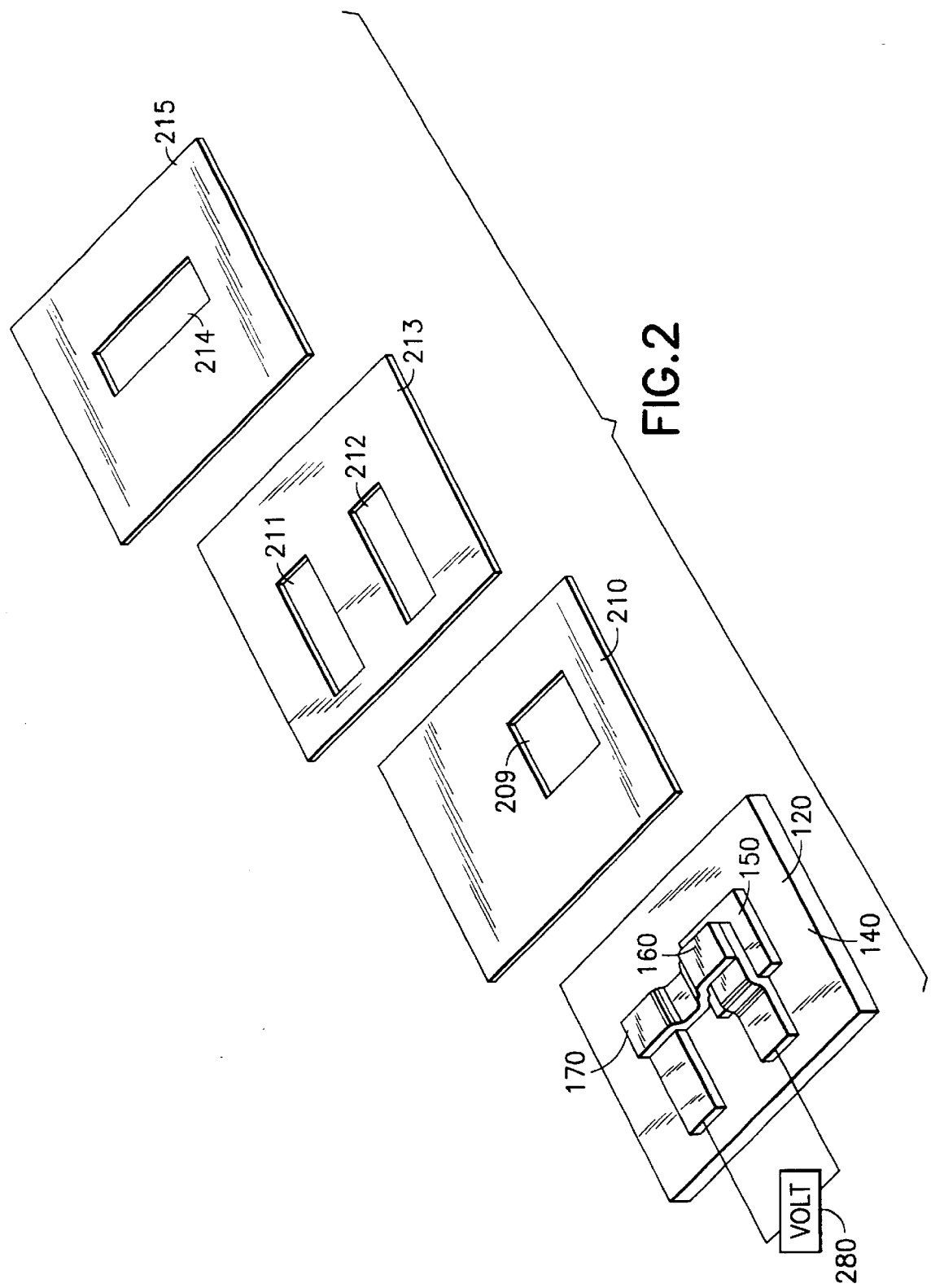

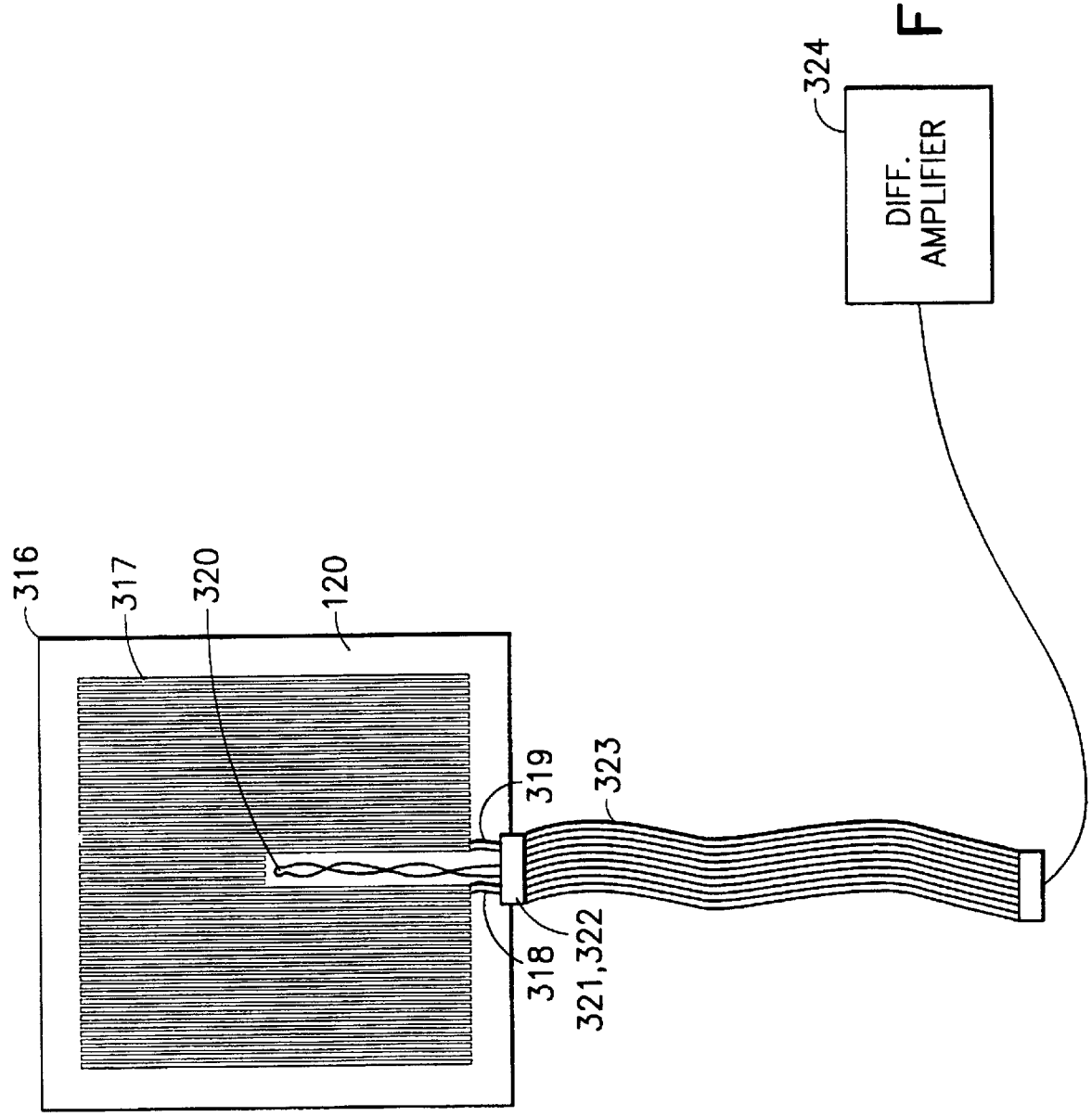

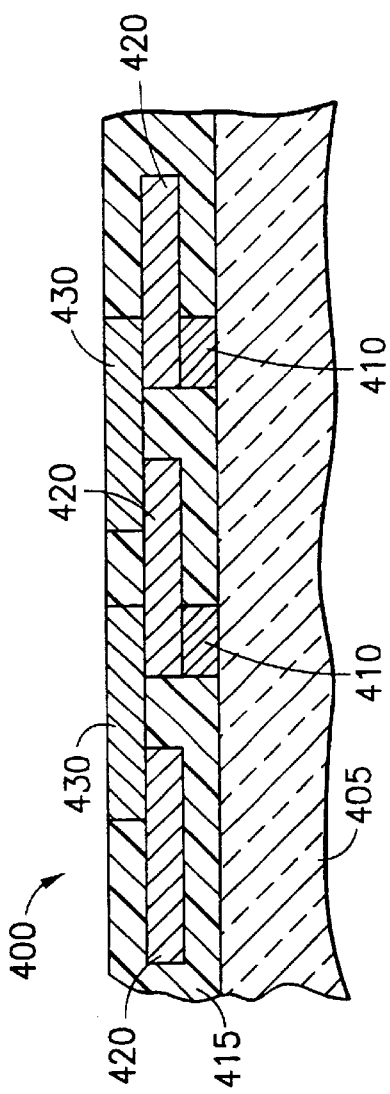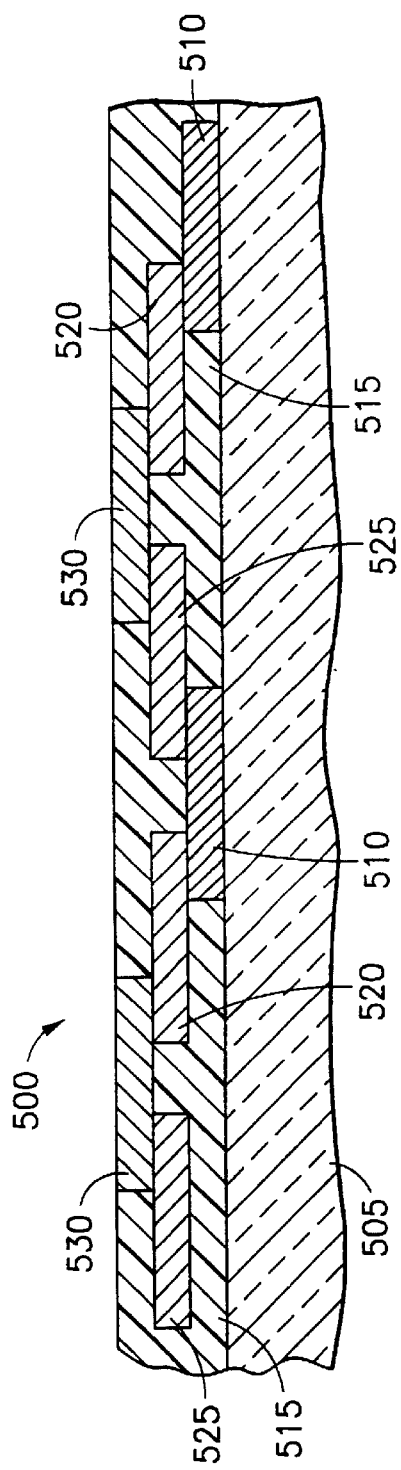

DIFFERENTIAL THERMOPILE HEAT FLUX TRANSDUCER

BACKGROUND OF THE INVENTION

1. Field of the Invention

The present invention is related generally to heat flux transducers and, more particularly, to a differential thermopile heat flux transducer having a plurality of layers and a high thermal conductivity top coating which enables the transducer to measure heat flux with improved accuracy.

2. Description of the Related Art

Heat flux sensors are routinely used to measure the rate and direction of heat energy flow. For example, heat flux sensors (or "transducers") have been used in building energy management applications since the 1950's. Methods for using heat flux transducers to evaluate thermal performance of building materials are generally well understood. Heat flux transducers designed for surface mounting are inexpensive and easy to install. However, it is often difficult to acquire accurate, useful data with heat flux sensors.

In combination with a temperature sensor disposed at the same location, a heat flux sensor and a temperature sensor can be used to measure temperature, heat flux, the heat transfer coefficient, the effective thermal capacity, the projected rate of temperature change at the present heat flux, and the projected rate of temperature change at any other value of heat flux. In addition, the temperature and heat flux signals can be compared to detect drift or failure of either sensor.

Measurement of heat flux is critical to the understanding and control of many thermal systems. When both heat flux and temperature data are available for the same point on a surface, material properties such as thermal resistance and thermal diffusivity can be calculated. Heat flux measurement is essential for the performance evaluation of insulative building materials. This is because it is often difficult or impossible to predict the installed performance of insulative materials from laboratory experiments.

The heat flux through a surface cannot, however, be measured without some disturbance caused by insertion of the measuring device into the path of heat flow. The amount of change produced by the measuring device depends on many factors. These include: the contact resistance between the heat flux transducer and the test wall, as well as other physical parameters such as surface emissivity, surface roughness and the thermal resistance of the heat flux transducer itself. These factors include the effective series thermal resistance, $R_m$. The following relationship is described in Trethowen, H. A., "Systematic Errors with Surface-Mounted Heat Flux Transducers and How to Live with Them", *In-Situ Heat Flux Measurements in Buildings—Applications and Interpretations of Results*, CRREL Special Report 91-3, 1991, U.S. Army Cold Regions Research and Engineering Laboratory, Hanover, N.H., Hanover, N.H., pp. 15–27:

$$R_m = R_h + R_c + (R_{ms} - R_s) \qquad (1)$$

Where:

$R_m$=effective series thermal resistance $R_h$=series thermal resistance (conductive) of the heat flux transducer alone $R_c$=thermal contact resistance between the heat flux transducer and substrate $R_{ms}$=total thermal surface resistance (convective and radiative) over the heat flux transducer $R_s$=total thermal resistance (convective and radiative) over surrounding area The effective series resistance of a surface mounted heat flux transducer is the most important single factor affecting the error produced by disturbance of the measured heat flux. If $R_{ms}$ and $R_s$ are made approximately equal by matching the emissivity and the surface roughness of the heat flux transducer to corresponding values for the surrounding material, the effective series resistance is reduced to the sum of the heat flux transducer series thermal resistance and the thermal contact resistance. The series thermal resistance can vary widely in commercially available surface mounted heat flux transducer's: from about 0.002 m²° C./W to 0.1 m²°C./W. The thermal contact resistance is minimized by attaching the sensor to the surface with a very thin layer of high thermal conductivity adhesive.

For maximum utility in building energy management, a heat flux sensor should have a series thermal resistance of less than $1 \times 10^{-4}$ m²° C./W. However, when the series thermal resistance of a thermopile type heat flux transducer is very low, its sensitivity may also be low because the low thermal resistance only produces a small temperature difference.

Another factor which affects the utility of a heat flux sensor in building energy management is shunting of heat flux around the sensor. A common way of solving this problem is to use a sensor with a large area, in the belief that the long path around the sensor will reduce the effects of shunting. This solution is not effective when the sensor has high thermal resistance, because the measured heat flux is that which passes through the sensor, and it is reduced by the sensor's thermal resistance. A more effective solution is to employ a sensor with low thermal resistance.

Large area sensors are also commonly used to measure heat flux over non-homogeneous areas, such as across wall studs in framed buildings, or on truss roofs. Unless the areas of the sensor covering the wall studs and the surrounding structure are in the same proportion as in the entire structure, this practice introduces an error. A better way of measuring heat flux over non-homogeneous areas is to employ small heat flux sensors over each representative part of the structure, and then calculate the total heat flux for each part using its actual total area. The total heat flux is then calculated by summing these amounts.

Another disadvantage of large area heat flux sensors is that they are relatively expensive. According to a recent survey, the typical cost of a commercially available 12" by 12" heat flux sensor is over $600.

Copper conductors of printed circuit boards may be produced by a number of processes. The most common of these is photoetching. In this process, a board completely coated with copper and covered by a photopolymer is (1) exposed to ultraviolet light through a negative transparency of the desired conductor pattern, (2) solvent washed to remove the polymer where it has not been hardened by exposure and (3) acid etched to expose the desired conductors.

A second process for producing printed circuit boards, known as the additive process, consists of a first step of electroless deposition of a very thin nickel layer representing the desired conductor pattern, followed by a second step of electrolytic deposition of the desired thickness of copper on the nickel conductors.

In a third process, which is less frequently used, conductors are deposited as inks on an insulating substrate by screen printing. The ink traces are dried to a solid by rapid heating in a vapor reflow oven, then converted to metal by an elevated heat treatment. This process could be adapted to heat flux sensor manufacturing, if it could be used to deposit conductors of two different metals in an appropriate pattern.

In U.S. Pat. No. 4,779,994, a thin film heat flux sensor and its method of manufacture are disclosed. The manufacturing method has certain drawbacks which limit the sensor performance and restrict the range of applications. The manufacturing cost of the sensor is high because it is made by multiple stages of sputtering through shadow masks. Another drawback is the relatively low sensitivity of the sensor. In U.S. Pat. No. 4,779,994, heat flux is measured by measuring the temperature drop across a very small thermal resistance, and signals are of the order of a few microvolts per watt/cm$^2$. In many applications for such sensors, heat flows to be measured are a small fraction of 1 watt/cm$^2$, and thin film sensors cannot be used.

Prior heat flux sensors also suffer additional drawbacks. Prior heat flux sensors fail to be equally responsive in sensing radiation, convection and conduction heat transfer. Moreover, such prior heat flux sensors are not responsive to heat transfer in both directions through the sensor. In addition, such prior sensors cannot be bent over a radius without loss of continuity or calibration.

SUMMARY OF THE INVENTION

The present invention overcomes the aforementioned disadvantages by providing a heat flux sensor (hereinafter called the "Episensor"), which contains a thermopile, including an electrically insulating substrate made of a material which has high thermal conductivity; a first layer disposed above said electrically insulating substrate, the first layer including (1) insulating material and (2) a plurality of thin raised metal pads covering a part of the surface of said substrate; a second layer disposed above said first layer, the second layer including (1) insulating material and (2) a plurality of metal links; a third layer disposed above the second layer, the third layer including (1) insulating material and (2) a plurality of metal links interconnecting the links of the second layer; a fourth layer disposed above the third layer, the fourth layer including (1) insulating material and (2) a plurality of metal pads; and a top layer disposed above the fourth layer made of a thin layer of high thermal conductivity material. Other aspects of the invention will become more readily apparent upon a review of the following detailed description of the present invention.

BRIEF DESCRIPTION OF THE DRAWINGS

FIG. 2 is an isometric view of an elementary heat flux sensor comprising a single thermocouple pair shown together with the masks used in its fabrication.

FIG. 3 shows an arrangement of many elementary heat flux sensors on a thin sheet of anodized aluminum, which, together with a thermocouple, comprise a heat flux transducer.

FIG. 4 is a side view of the elements of a second generation heat flux sensor developed during the design of the preferred embodiment of the present invention.

FIG. 5 is a side view of the elements of a third generation heat flux sensor developed during the design of the preferred embodiment of the present invention.

FIG. 9 is a perspective view of the anodized aluminum substrate with a first layer of high thermal resistance polymer deposited thereon.

FIG. 10 depicts four nickel pads, isolated in space, which make up a portion of the first layer of the preferred embodiment of the present invention depicted in FIG. 8.

FIG. 11 depicts four nickel links, which make up a portion of the second layer of the preferred embodiment, as deposited above the first layer depicted in FIG. 10.

FIG. 12 depicts four copper links, which make up a portion of the third layer of the preferred embodiment, as deposited above the second layer depicted in FIG. 11.

FIG. 13 depicts the four copper pads, which make up a portion of the fourth layer of the preferred embodiment, as deposited above the third layer depicted in FIG. 12.

DETAILED DESCRIPTION OF THE STRUCTURE AND DEVELOPMENT OF

THE PREFERRED EMBODIMENT OF THE PRESENT INVENTION

Figure 1:
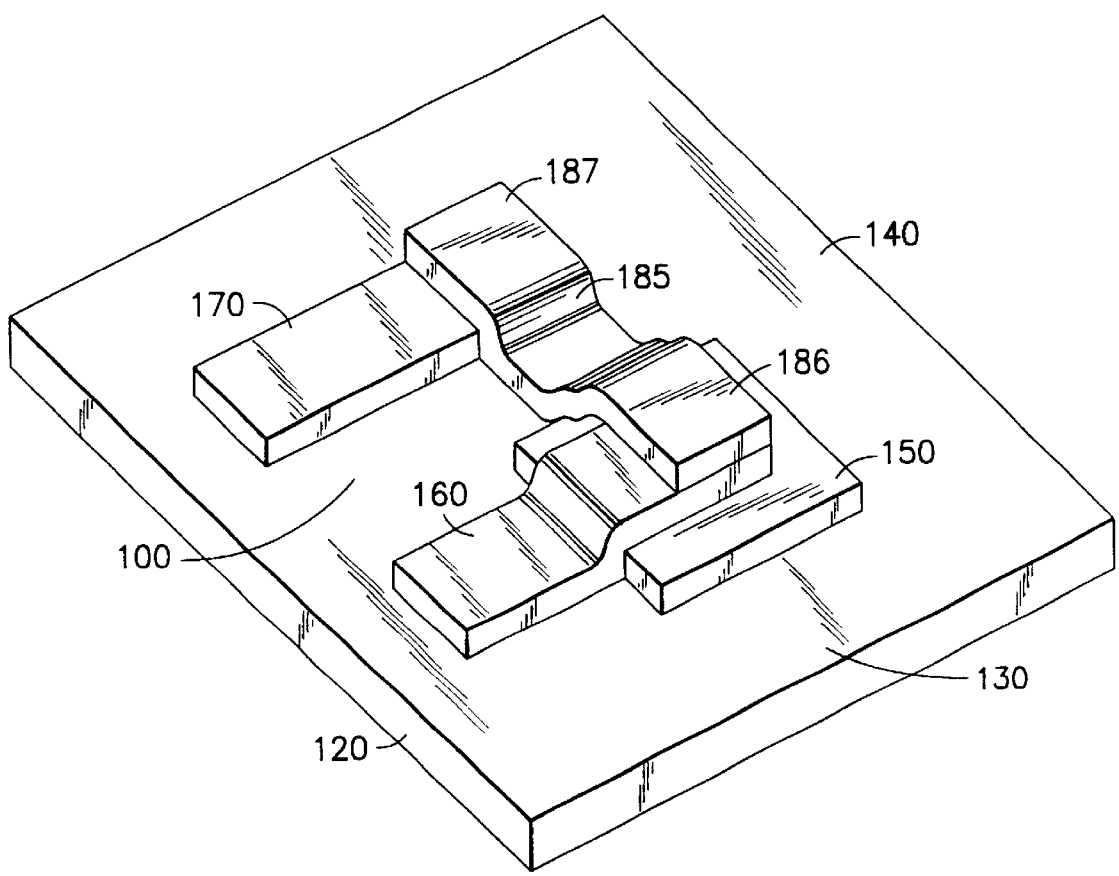
FIG. 1 is an isometric view of a first generation elementary heat flux sensor comprising a single thermocouple pair, formed on a thin sheet of anodized aluminum.

With reference to the attached drawings, the structure and development of the preferred embodiment (the "Episensor") of the present invention will now be described. Identical reference numerals in different drawings refer to the identical structure. The first number of each reference numeral indicates the first figure in which that reference numeral has been introduced.

Development of the Episensor

1. The 1st Generation Improved Heat Flux Sensor

In U.S. Pat. No. 5,990,412, herein incorporated by reference, a heat flux sensor and its method of manufacture, which contained various improvements over prior known heat flux sensors and their methods of manufacture, were disclosed. This first generation improved heat flux sensor is depicted in FIG. 1. With reference to FIG. 1, the sensor 100 consists of a thin sheet of aluminum 120 which has been anodized on at least one surface 130. Anodization produces a thin aluminum oxide layer 140 to electrically insulate the sensor elements from the aluminum. This layer is thin enough to allow heat to flow through the sensor with little resistance. A part of the anodized surface 130 of the sheet 120 is coated with a polymeric insulating pad 150. This pad locally increases resistance to the flow of heat over the portion of the surface it covers. A copper signal electrode 160 is deposited partly on top of the insulating pad 150 and partly on the aluminum oxide layer 140. A copper reference electrode 170 is deposited entirely on the aluminum oxide layer 140. One end of a nickel crossover electrode 185 overlaps the part of the copper signal electrode which is on top of the insulating pad 150, forming a first thermocouple junction 186. Theother end overlaps the copper reference electrode, forming a second thermocouple junction 187. Certain steps in the construction of this elementary heat flux sensor are depicted in FIG. 2. The aluminum sheet 120 is prepared by anodization, a process which exposes the metal surface to an oxidizing acid in an electrolytic tank. The oxide layer 140 built up by this process is dense and has very good electrical insulating qualities. After the aluminum is anodized, the insulating pad 150 is deposited on its insulated surface by silk-screening of an ink containing a polymer dielectric. The ink is deposited on the surface through an aperture 209 in a first silk screen 210, and then dried and heat-cured to produce the solid insulating pad 150. The next step is to apply a copper-containing ink through apertures 211 and 212 in a second silk screen 213, followed by drying and heat-curing. This step produces the copper electrodes of thermocouples 160 and 170. The final step of fabrication is to apply a nickel-containing ink through aperture 214 in a third silk screen 215, followed by drying and heat-curing. This completes the first generation heat flux sensor. The copper electrodes of the two thermocouples are connected to a voltage measuring instrument 280, providing a direct indication of heat flux.

The first generation heat flux sensor operates as follows. When heat flows through the substrate from its top to its bottom surface, a difference in temperature develops between thermocouples 186 and 187. This occurs because the total resistance of the heat path through the aluminum sheet and the polymeric insulating pad 150 is greater than that through the aluminum sheet alone. The temperature difference will persist as long as the heat continues to flow. The thermocouple 186 located on the insulating pad 150 will be slightly hotter than thermocouple 187. This difference in temperature will produce a small positive voltage across the copper electrodes of the sensor, and the voltage will be sensed by the voltage measuring instrument 280. The magnitude of the voltage is proportional to heat flux through the sensor because the difference in the thermocouple temperature is proportional to heat flux.

If the heat flux direction is reversed, the temperature of the thermocouple 186 will be lower than that of thermocouple 187, and the polarity of the signal will be reversed. Thus the polarity of the signal indicates the direction of heat flow.

The magnitude of the voltage signal produced by the first generation heat flux sensor is very small. Typically the temperature difference across the insulating pad 150 will be a fraction of a degree centigrade, and the signal produced by the opposed potentials of the two thermocouples will be a few microvolts, not enough for accurate measurements in real applications. To produce a more useful signal, a sensor may be constructed of many elementary heat flux sensors, connected in a series arrangement which adds their voltages together. Up to thousands of thermocouple pairs may be so connected to measure heat flux over a large area. Such an arrangement is shown in FIG. 3.

More particularly, FIG. 3 shows a heat flux transducer 316, fabricated using dielectric and conductive inks. The heat flux transducer is fabricated on a thin sheet of aluminum 120 which has been anodized over its entire top surface to electrically isolate the sensor elements. The heat flux sensor 317 comprises a series connected array of 18,900 elementary heat flux sensors as shown in FIG. 1. The ends of this array terminate in connection leads 318 and 319. An individual wire thermocouple 320 is bonded to the top surface of the aluminum sheet 120, and its connection leads 321 and 322 are located between the leads 318 and 319 of the heat flux sensor 317. Each of the four connection leads is connected to a wire of the flat cable 323, which carries the signals of the heat flux transducer to an amplifier 324.

In employing the heat flux transducer of FIG. 3 for measurements, the surface whose heat flux and temperature are to be measured is prepared with a thin layer of adhesive, such as Duro All-Purpose Spray Adhesive, distributed by Loctite Corporation. The heat flux transducer is then pressed flat onto the prepared surface with the heat flux sensor 317 and thermocouple 320 side facing out. Then the flat cable 323 is connected to the amplifier 324, and measurements can begin.

The thick film conductors used in the sensor of the invention are conductive copper and nickel inks. These inks, as well as methods for their deposition and curing, were developed by Toronaga Technology Inc.

2. The 2nd Generation Heat Flux Sensor

Although the first generation sensor has greatly improved sensitivity and performance characteristics over prior sensors, additional development has been conducted to further improve the design. In particular, although the first generation sensor can be adequately manufactured using the silk screening process depicted in FIG. 2, the deposition of metal conductors which bridge the difference in height between the substrate and the top of the insulating pads has proven to be difficult. In addition, it has been found that the sensitivity of the first generation sensor to conducted heat flux is very different from its sensitivity to radiated heat flux.

In response to these difficulties, the second generation heat sensor depicted in FIG. 4 was developed. More particularly, FIG. 4 is a sectional view of the second generation heat sensor 400, which is mounted on a substrate 405, and contains three layers 410, 420 and 430. Each of the three layers is approximately 0.001" (0.003 cm) thick. The bottom layer includes a plurality of nickel pads 410 surrounded by polymeric insulating material 415. The middle layer has links of nickel 420 is overlapping the bottom layer pads 410, each link 420 is surrounded by a narrow region of polymeric insulating material 415. The top layer has links of copper 430, each of which partially overlaps two of the nickel links 420, each link 430 being surrounded by a narrow region of polymeric insulating material 415. This arrangement forms a continuous conductor with a regular sequence of Cu/Ni thermocouple pairs. One of the junctions in each pair is located directly over a nickel pad of the first layer. The second one is located over the polymeric insulating material in the first layer.

This second generation heat sensor has the additional feature that the top surface of the sensor is smooth. It was anticipated that this would enhance heat transfer in the conductive mode by reducing contact resistance, and make the resulting device a much more reliable product.

This second generation heat flux sensor has been tested extensively, and its performance was disappointing. Finite element analysis showed the reason: only a small part of the temperature difference produced across the sensor by passage of heat flux is actually transduced into a voltage by the thermopile. Another problem is that the sensor has different responses to radiative, convective and conductive heat flux. In view of these problems, further analysis and redevelopment of the sensor design was conducted.

The sensitivity of a sensor covering a given area is proportional to the density of thermocouple pairs that can be produced by the ink deposition process. In one process for manufacturing heat flux sensors, the minimum overlap of layers, minimum line widths and minimum space between lines, are all limited to 0.005" (0.013 cm).

The electrical output of such a sensor is the sum-of the individual small voltages produced by many Cu/Ni thermocouple pairs. One index of the performance of such a sensor is the proportion of the temperature difference produced by heat flux across the three layers that is actually sensed by the thermocouple pairs. In actual tests, the voltage produced by the second generation sensor was less than 10% of that predicted by finite element analysis. Further study of the second generation sensor through finite element models of the configuration resulted in a conclusion that there are two reasons for its poor performance. First, the stack of three layers of metal, consisting of a bottom pad and middle link of nickel and a top pad of copper, produce an approximately equal division of temperatures across the device, and limit the temperature at the "cold" junction to ⅓ of the temperature drop below the top temperature. This temperature is not very different from that of the other ("hot") junction, which is insulated by a layer of polymer on the bottom. Second, heat flowing horizontally through the nickel link in the middle layer tends to further equalize the temperature of the two junctions and reduce the voltage output even more.

One hundred sensors of this design were made, and the first 50 assembled had an average sensitivity of 26.41 millivolts/W/cm$^2$, about one fourth of what had been projected. Competitive sensor products provide about 60 millivolts/W/cm$^2$.

In analyzing the deficiencies of this sensor, a finite element model was generated to try to predict the output of the current design. Assuming that the temperature at the cold junction thermocouple is close to that of the substrate and the temperature of the hot junction thermocouple is close to that of the top of the insulation, a ΔT across the insulation layer can be calculated. This ΔT should be proportional to the incident heat flux to the system. The model predicted a ΔT across the insulation layer of 4.638° C. at a heat flux of 10 watts/cm$^2$.

From this, a sensitivity of a sensor can be theoretically calculated according to the equation:

$$S = \frac{(\# \, TC \, \text{Pairs}) \times (\text{Seebek Coefficient}) \times (\Delta T)}{(\text{heat flux}, \, q'')}$$

The corresponding Seebek coefficient for the Cu/Ni ink thermocouple is approximately 4.2 $\mu$V/° C. and the number of thermocouple pairs (#TC pairs) is 18,900, resulting in a predicted sensitivity of 36.921 mV/(W/cm$^2$) for the second generation design. This agrees fairly closely with the average experimental value of 26.41 mV/(W/cm$^2$).

Sensitivity can be improved in one of three ways: (1) increase the number of thermocouple pairs, (2) change the Seebek coefficient, or (3) raise the ΔT across the insulation layer. The number of thermocouple pairs was limited by the resolution of the fabrication process, and the only metals that could be deposited by the process were copper and nickel. Various changes were made in the model to try to improve the ΔT.

Upon analyzing the deficiencies of this second generation sensor, the largest problem was determined to be the lateral flow of heat along the links. Rather than heat conducting through the hot junction, it is conducting laterally along the link, to the cold junction, and then directly to the substrate. This results in a lower ΔT than would be provided if no "communication" existed between the hot and the cold junction. This could account for a lower sensitivity than what was predicted.

3. The 3rd Generation Heat Flux Sensor

With reference to FIG. 5, a third generation sensor with improved sensitivity over the second generation sensor is shown. This improved sensitivity is the result of insulating the "hot" junction from the cold face of the sensor by a layer of polymer, and insulating the "cold" junction from the hot face of the sensor by a layer of polymer. With reference to FIG. 5, the third generation sensor 500, as mounted on a substrate 505, contains a bottom layer having nickel pads 510 surrounded by polymeric insulating material 515. The middle layer contains both nickel links 520 and copper links 525, each of which are surrounded by polymeric insulating material 515. The top layer contains copper pads 530 surrounded by polymeric insulating material 515. Nickel pads 510 and copper pads 530 serve as bridges which interconnect nickel links 520 and copper links 525. For example, one nickel pad 510 bridges a nickel link 520 with a copper link 525.

Unfortunately, this design requires that the center layer of the sensor contain both metals. Because of process limitations, such an arrangement would increase the spacing required between elements. Thus the increase in sensitivity per thermocouple pair resulting from better temperature "capture" would be sacrificed by junction density reduction. Modeling of this sensor revealed that despite a significant increase in thermal sensitivity per thermocouple pair, the density of the junction pairs would be significantly reduced. In fact, such modeling revealed that although up to 90% of the temperature difference across the sensor would appear across the thermocouple pair, the density of junction pairs would be reduced by a factor of 4 or more. The net gain in sensitivity therefore would be negligible.

In particular, the results of a modeling analysis of this sensor showed an increase in ΔT and a decrease in the number of thermocouple pairs. Various pad sizes and link sizes were modeled to try to determine the optimum sizes that would produce the greatest net increase in sensitivity.

The results from each model are shown in the table below with the third generation heat flux sensor highlighted:

TABLE 1

| BotBC | TopBC | Generation # | Pad Sz[1] | Link Sz[1] | ΔT | #/TC | Eff S |
|---|---|---|---|---|---|---|---|
| q" | q" | 2 | 1 × 1 | 1 × 3 | 4.085 | 4 | 1.0213 |
| q" | q" | 3 | 3 × 3 | 1 × 4 | 12.342 | 10 | 1.2342 |
| q" | q" | 3 | 1 × 3 | 1 × 3 | 4.638 | 4 | 1.1595 |
| T | q" | 3 | 3 × 3 | 1 × 4 | 13.895 | 10 | 1.3823 |
| T | T | 2 | 1 × 1 | 1 × 3 | 1.184 | 4 | 0.2960 |
| T | T | 3 | 3 × 3 | 1 × 4 | 13.200 | 10 | 1.3200 |
| T | q" | 3 | 1 × 3 | 1 × 4 | 11.150 | 10 | 1.1102 |
| T | q" | 3 | 1 × 3 | 1 × 3 | 10.233 | 8 | 1.2744 |
| T | q" | 3 | 1 × 2.5 | 1 × 2.5 | 8.192 | 6 | 1.3620 |
| T | q" | 3 | 1 × 2 | 1 × 2 | 7.090 | 6 | 1.1807 |
| T | q" | 3 | 1 × 2o[2] | 1 × 2o[2] | 6.683 | 6 | 1.1127 |
| T | T | 3 | 1 × 3 | 1 × 4 | 12.961 | 10 | 1.2961 |
| T | T | 3 | 1 × 3 | 1 × 3 | 12.530 | 8 | 1.5663 |
| T | T | 3 | 1 × 2.5 | 1 × 2.5 | 11.973 | 6 | 1.9955 |
| T | T | 3 | 1 × 2 | 1 × 2 | 11.224 | 6 | 1.8707 |
| T | T | 3 | 1 × 2o[2] | 1 × 2o[2] | 11.247 | 6 | 1.8745 |
| T | q" | 3 | 1 × 4 | 1 × 2 | 5.359 | 8 | 0.6698 |
| T | q" | 3 | 1 × 4 | 1 × 3 | 10.386 | 10 | 1.0367 |
| T | q" | 3 | 1 × 4 | 1 × 4 | 11.694 | 12 | 0.9715 |
| T | q" | 2 | 1 × 1 | 1 × 3 | 5.024 | 4 | 1.2400 |
| T | q" | 2 | 1 × 1 | 1 × 4 | 7.933 | 6 | 1.2923 |

[1] 1 unit is a 5 mil × 5 mil pad
[2] o indicates a large overlap of the pad and link for the hot junction In modeling, the boundary conditions on the bottom (BotBC) and top (TopBC) of the sensor were changed to measure the difference between its responses to radiative and conductive heat flux. A "q'''" boundary condition represented radiative heat flux of 10 watts/cm$^2$, a "T" boundary condition represented conductive heat flux between a bottom temperature of 25° C. and a top temperature of 40° C.

To represent losses in density, the parameter (#/TC) was created. It is defined as the number of 5 mil×5 mil blocks necessary to make up a repeating pattern. The ΔT was then divided by the #/TC parameter to determine an effective sensitivity to compare each of the models. As seen above, none of the models resulted in a significant increase in the Effective Sensitivity.

It is difficult to relate the effective sensitivities of constant temperature and constant heat flux boundary conditions. The model did not compute an overall heat flux for the constant temperature condition, and the temperatures predicted for the constant heat flux condition were not equal across the face of the sensor.

4. The 4th Generation Heat Flux Sensor

Figure 6:
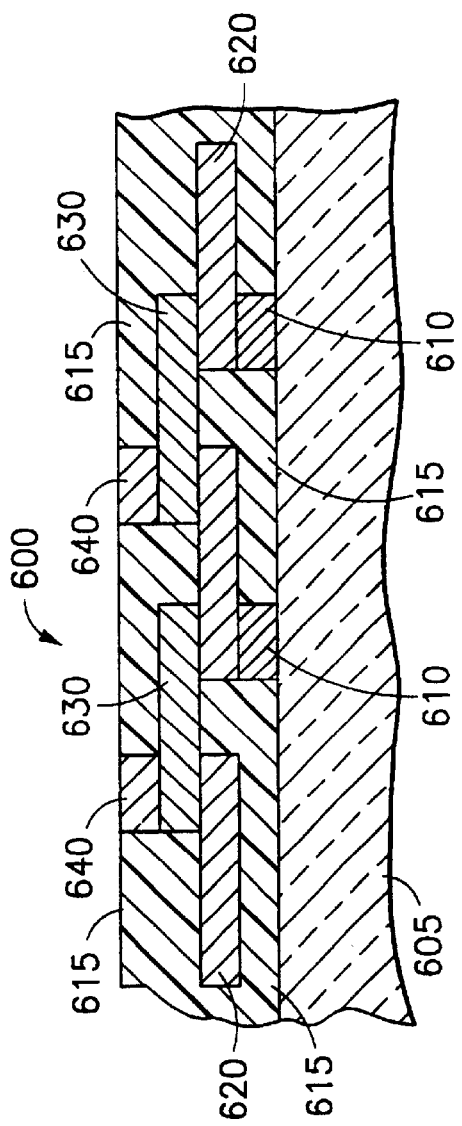
FIG. 6 is a side view of the elements of a fourth generation heat flux sensor developed during the design of the preferred embodiment of the present invention.

To overcome the difficulties of the third generation sensor which use two metals in the middle layer, the fourth generation sensor was developed. The configuration of the second generation was modified to improve its thermal performance, while retaining its high density of thermocouple pairs. With reference to FIG. 6, the sensor 600 is shown as mounted on a substrate 605. Sensor 600 includes a bottom layer of nickel pads 610 surrounded by polymeric insulating material 615. The second layer includes a plurality of nickel links 620. The third layer includes a plurality of copper links 630. A fourth layer of copper pads 640 is disposed above the copper links 630. Each of these four layers also includes an amount of insulating material 615 disposed between the aforementioned other elements of each layer.

By using such a fourth layer containing copper pads 640, this configuration provides insulation directly over the "cold" junctions, effectively isolating the junctions from heat flux, finite element analysis of this configuration has revealed that the temperature difference between the "hot" and "cold" junctions exceeds 75% of the total. Furthermore, such an arrangement can be produced at the same density as the original first generation Episensor. Although there is a slight increase in thermal resistance produced by this fourth layer of copper pads 640, this arrangement achieves significant advantages over prior heat flux sensors.

The results from this modelling analysis are tabulated below with the optimum configuration providing the highest theoretical sensitivity highlighted. This table shows the effect of the top layer having various thicknesses.

TABLE 2

| Thickness (mils) | Generation # | Pad Sz[1] | Link Sz[1] | ΔT | #/TC | Eff S |
| --- | --- | --- | --- | --- | --- | --- |
| 0 | 2 | 1 × 1 | 1 × 3 | 4.638 | 4 | 1.1595 |
| 1 | 3 | 1 × 4 | 1 × 2 | 6.875 | 8 | 0.859 |
| 2 | 3 | 1 × 4 | 1 × 2 | 6.81 | 8 | 0.851 |
| 3 | 3 | 1 × 4 | 1 × 2 | 6.791 | 8 | 0.849 |
| 1 | 3 | 1 × 4 | 1 × 3 | 12.941 | 10 | 1.294 |
| 2 | 3 | 1 × 4 | 1 × 3 | 12.916 | 10 | 1.292 |
| 3 | 3 | 1 × 4 | 1 × 3 | 12.846 | 10 | 1.285 |
| 1 | 3 | 1 × 3 | 1 × 3 | 14.607 | 12 | 1.217 |
| 2 | 3 | 1 × 3 | 1 × 3 | 14.598 | 12 | 1.217 |
| 3 | 3 | 1 × 3 | 1 × 3 | 14.484 | 12 | 1.207 |
| 1 | 2 | 1 × 1 | 1 × 4 | 16.244 | 6 | 2.707 |
| 0.5 | 2 | 1 × 1 | 1 × 4 | 15.972 | 6 | 2.662 |
| 1 | 2 | 1 × 1 | 1 × 4 | 13.372 | 6 | 2.229 |
| 1 | 2 | 1 × 1 | 1 × 3 | 12.114 | 4 | 3.029 |
| 2 | 2 | 1 × 1 | 1 × 3 | 12.141 | 4 | 3.035 |
| 3 | 2 | 1 × 1 | 1 × 3 | 11.977 | 4 | 2.994 |
| 0.5 | 2 | 1 × 1 | 1 × 3 | 11.893 | 4 | 2.973 |
| 0.25 | 2 | 1 × 1 | 1 × 3 | 11.482 | 4 | 2.871 |

The end results of these studies predicted a 185% increase in sensitivity over the first generation sensor design. For 18,900 thermocouple pairs, a Seebek coefficient for the thermocouple of 4.2 $\mu V/°C$, and ΔT of 12.141° C. for an incident heat flux of 10W/cm$^2$, the sensitivity should be approximately 80 mV/(W/cm$^2$).

5. The 5th Generation (Preferred) Heat Flux Sensor In evaluating the fourth generation heat flux sensor, the effects of two different boundary conditions on the top layer were analyzed. A boundary condition of constant heat flux over the top surface simulated radiated heat flux, and a constant temperature boundary condition simulated conducted heat flux. The performance of the sensor with these two conditions was predicted to be very different. The sensitivity with constant heat flux was much less than the sensitivity with constant temperature. With constant heat flux, a pattern of temperatures developed on the upper face, with higher temperatures over the polymer insulated portion of the sensor and lower temperatures over the metal pads. As such, leakage through the polymer, which has the largest area, was increased, thereby reducing the effective sensitivity of the sensor to radiant heat flux.

Figure 7:
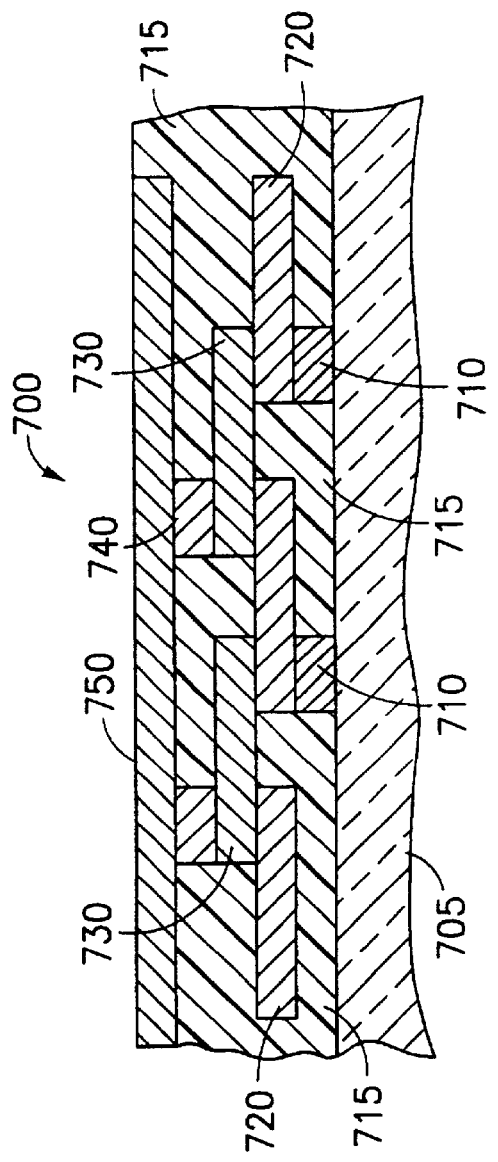
FIG. 7 is a side view of the elements of a fifth generation and preferred embodiment of the heat flux sensor of the present invention.

The solution to this problem was found in adding a thin layer of high thermal conductivity material over the surface of the sensor, to prevent development of "hot spots" over the polymer. Such an arrangement is shown in FIG. 7. The arrangement of FIG. 7 is identical to the arrangement of FIG. 6, with the exception of the thin layer of high thermal conductivity material 750 over the surface of the sensor 700. As such, the fifth generation sensor 700, as mounted on a substrate 705, contains a bottom layer having nickel pads 710 surrounded by polymeric insulating material 715. The second layer contains a plurality of nickel links 720, each of which are surrounded by polymeric insulating material 715. The third layer contains a plurality of copper links 730 surrounded by polymeric insulating material 715. A fourth layer of copper pads 740 is disposed above the copper links 730. Although the thin layer of high thermal conductivity material 750 is preferably made of aluminum, it is to be understood that other high thermal conductivity materials could also be used.

Figure 8:
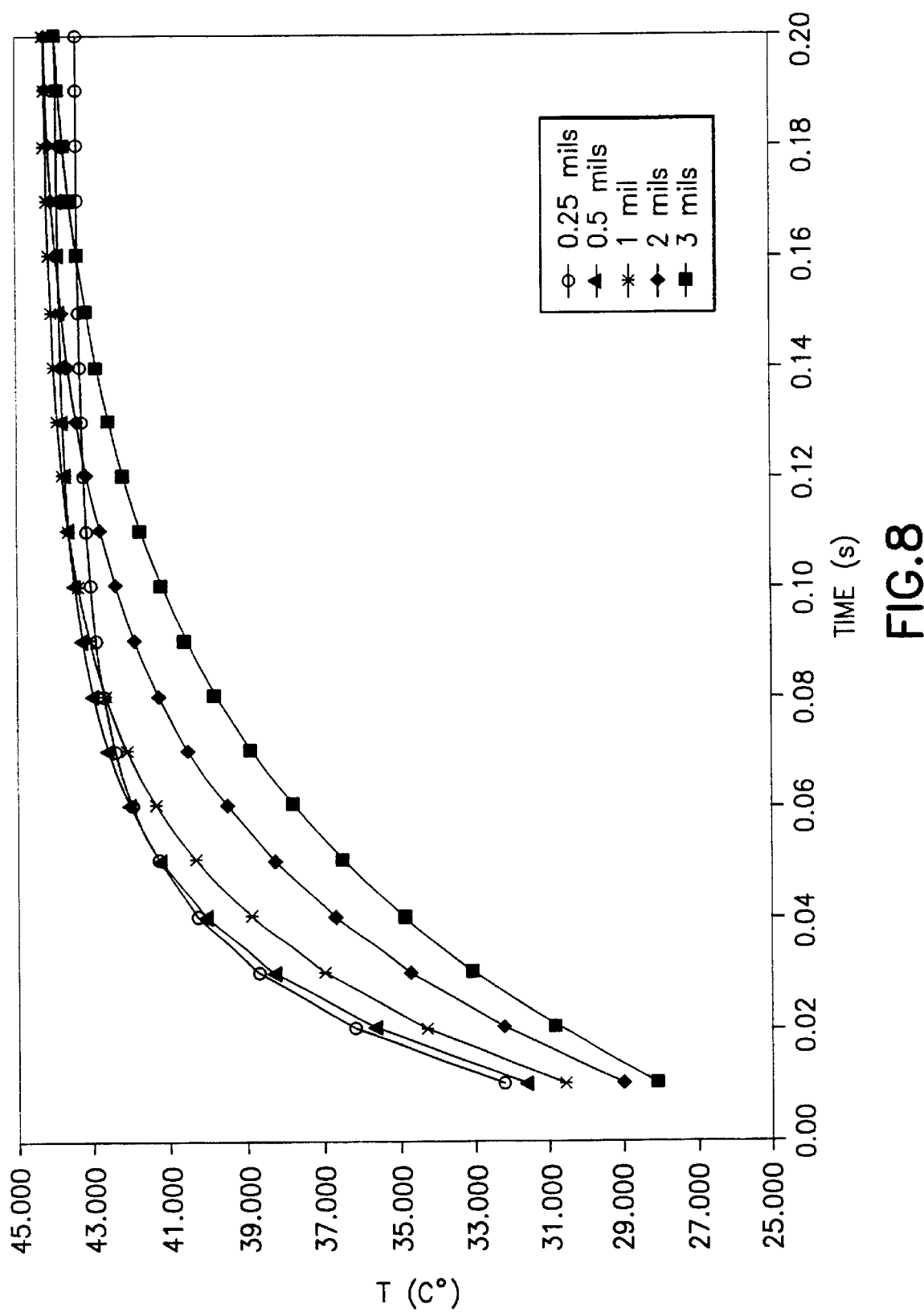
FIG. 8 depicts the effects of top layer thickness on the interface temperature of the sensor.

The effect of the thickness of layer 750 on sensitivity predicted by the model is illustrated in FIG. 8. A relatively thin layer of 0.001" (0.003 cm) would have a dramatic and unexpected effect on the interface temperature. Thinner layers would result in reduced sensitivity to radiative heat flux, while thicker layers would retard the sensor's time response without usefully increasing its sensitivity.

The aluminum layer 750 must be applied in a manner that does not electrically short the copper top pads of the sensor together. An electrically insulating adhesive, applied as a thin film, is used to prevent shorting of the copper top pads.

The importance of the top layer is significant. It is extremely important to have thermal contact while maintaining electrical isolation. Without the top layer, the incident heat flux can only pass through the junctions. Any location that is not a junction (i.e. dielectric) will merely heat up. This effect of "funneling" the heat into the junction is the main reason for the increase in sensitivity. The optimum thickness of the Aluminum layer for the new design was found to be 2 mils.

In particular, by utilizing an arrangement having a fourth layer with top copper pads 740 and a thin layer of aluminum 750 to distribute radiative heat flux over the top surface, numerous benefits and advantages are achieved. Among these benefits and advantages are the following:

1. Because both surfaces of the sensor are planar, excellent conductive heat transfer characteristics are exhibited.

2. The thermal resistance of the sensor is very low, approximately 0.00012 m$^{2°}$ C./W, because it is thin and based on a substrate of aluminum and because the paths for heat through the sensor are mostly metallic.

3. The sensitivity of the sensor is high (approximately 80 mV/(W/cm$^2$)) because it has a very dense pattern of thermocouple pairs.

4. The sensitivity of the sensor is also high because a large proportion of the temperature difference across it is transduced into a voltage.

5. The response of the sensor to radiation, convection and conduction is equal. As such, the sensor can be calibrated in one mode of heat transfer and used for measurements in other modes. Response to radiated, convected and conducted heat flow are identical because the temperature distribution across the face of the sensor is the same in all three cases. Prior heat flux sensors of this type have had a major deficiency in this regard. With such prior heat flux sensors, it was not possible to relate their calibration in one mode to measurements in another.

6. The sensor's sensitivity is the same to heat flowing in either direction, because the sensing elements are geometrically symmetrical. This is an advantage in any application where heating or cooling may occur at different times. For example, in architectural applications, heat flows in different directions during different seasons of the year.

7. The sensor is rugged and can be bent over a radius without loss of continuity or calibration.

8. The symmetry of the sensor guarantees that a zero signal truly represents zero net heat flow.

9. The conductive aluminum layer on top of the sensor is also a good electrical shield. Sensor elements are not exposed to electromagnetic interference, thus the noise induced in the sensor is very low, and the minimum measurable heat flux is very small.

10. The aluminum layer on top of the sensor provides some protection against accidental contact with the copper pads, eliminating a source of possible error or damage.

11. The aluminum layer provides some mechanical protection from external elements.

12. Because the sensor is flat and smooth on both sides, the sensor may be properly bonded to a surface on which it is applied. As such, the sensor possesses superior bonding characteristics.

Manufacture of the Episensor

Figure 9:
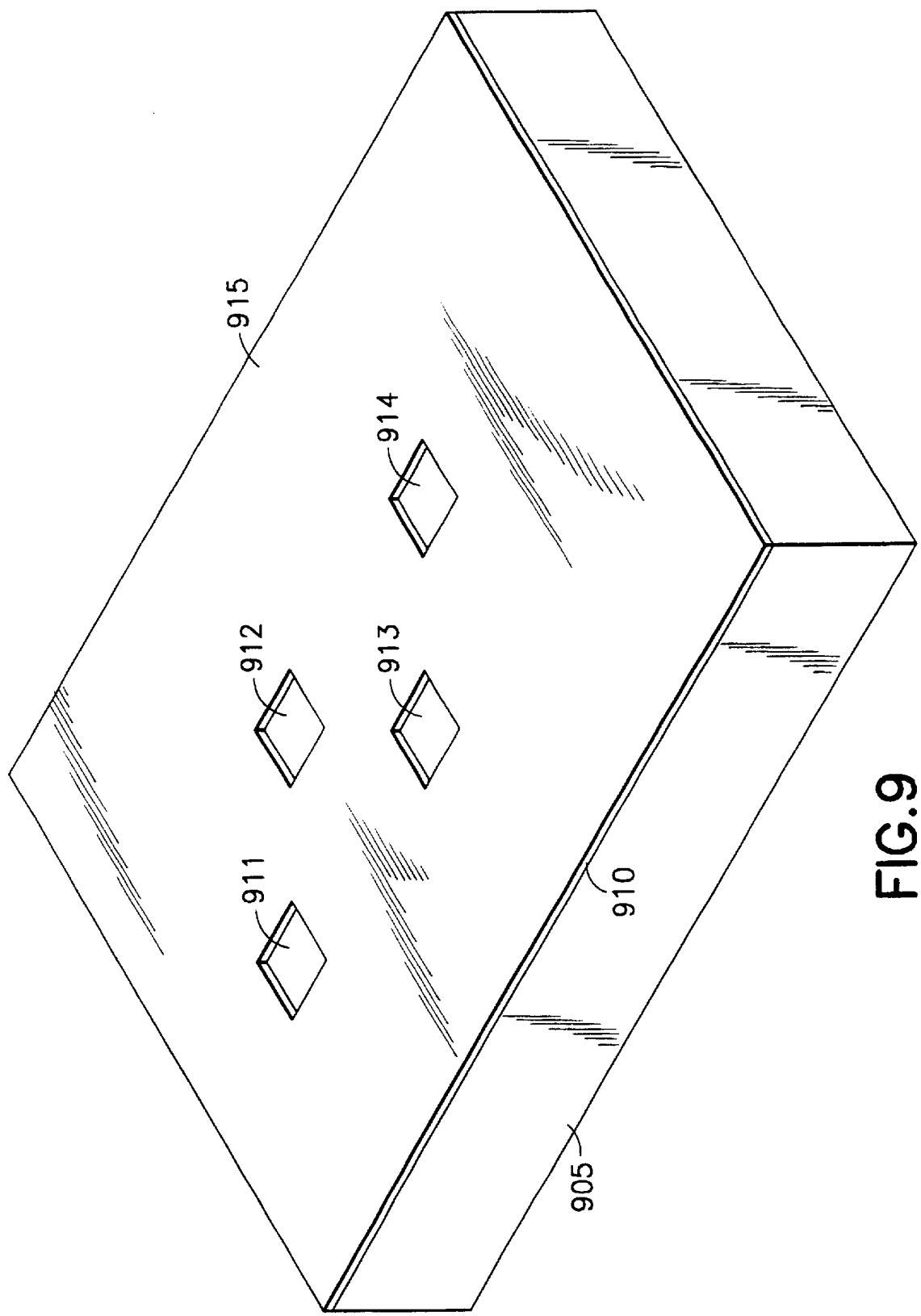
FIGS. 9–13 depict various stages of one technique for manufacturing the preferred embodiment of the present invention depicted in FIG. 8.

With reference to FIGS. 9–13, one method of manufacturing the episensor of FIG. 8 is shown and will now be described. FIG. 9 shows an anodized aluminum substrate 905 with a first layer of high thermal resistance photopolymer 910 deposited on it. The photopolymer is applied on the substrate with uniform thickness, then exposed through a mask to create four areas which are more soluble than the surrounding polymer. These areas are dissolved away chemically, leaving depressions 911, 912, 913 and 914 for the first layer of nickel ink.

The next step in fabrication of the sensor is to apply the nickel ink over the top surface 915 in such a way that each depression is filled, level to the top. The part is then cycled through a high temperature that causes the ink to solidify within the depression. The resulting part has a smooth upper surface, ready for the next layer of photopolymer and ink. These are applied in precisely the same manner, but with a different mask and pattern.

Figure 10:
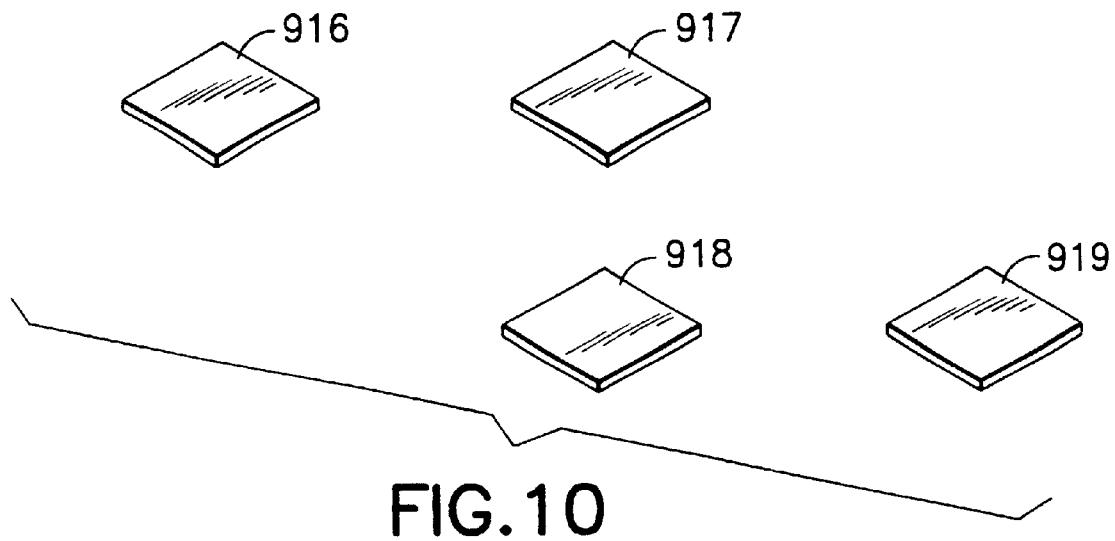

FIG. 10 shows four nickel pads 916, 917, 918 and 919 produced by these first steps, as though they were isolated in space. These pads correspond to pads 710 of FIG. 7.

Figure 11:
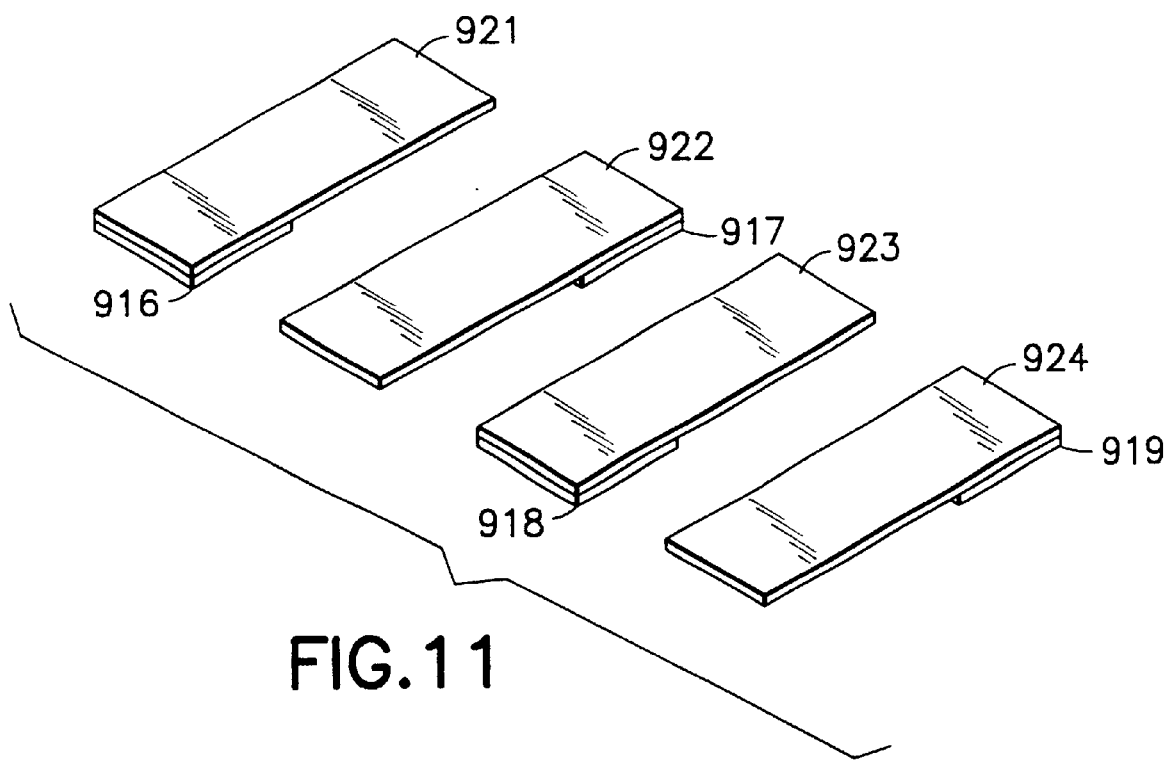

FIG. 11 shows four nickel links 921, 922, 923 and 924 which are deposited over pads 916, 917, 918 and 919, respectively, in the next step of the process. These links 921–924 cover the first four pads 916–919 and extend beyond them over the polymer surface. Links 921–924 correspond to links 720 of FIG. 7.

Figure 12:
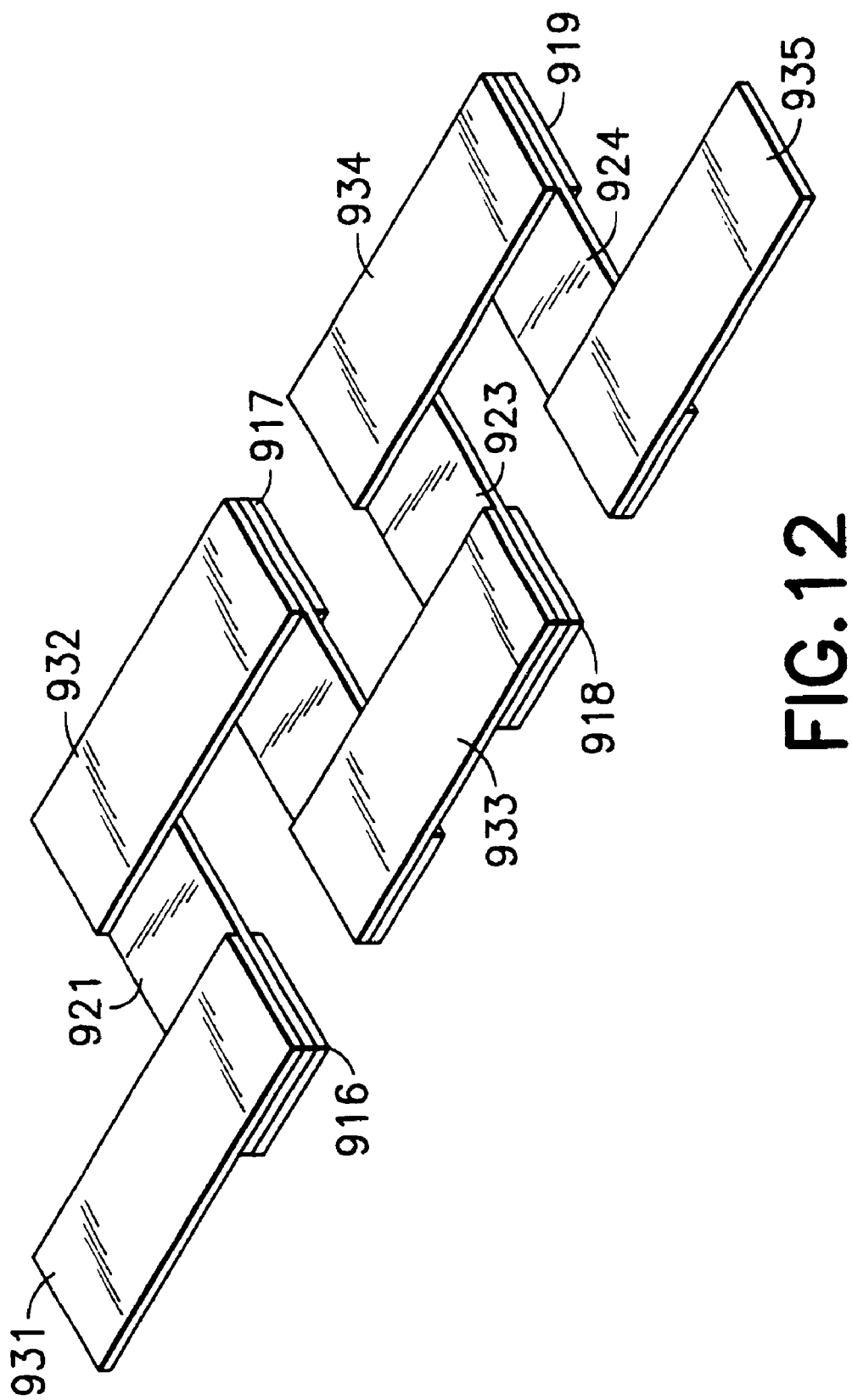

With reference to FIG. 12, the first deposited copper metal layer is shown, with links 931, 932, 933, 934 and 935 completing the thermopile. Links 931–935 correspond to links 730 of FIG. 7.

Figure 13:
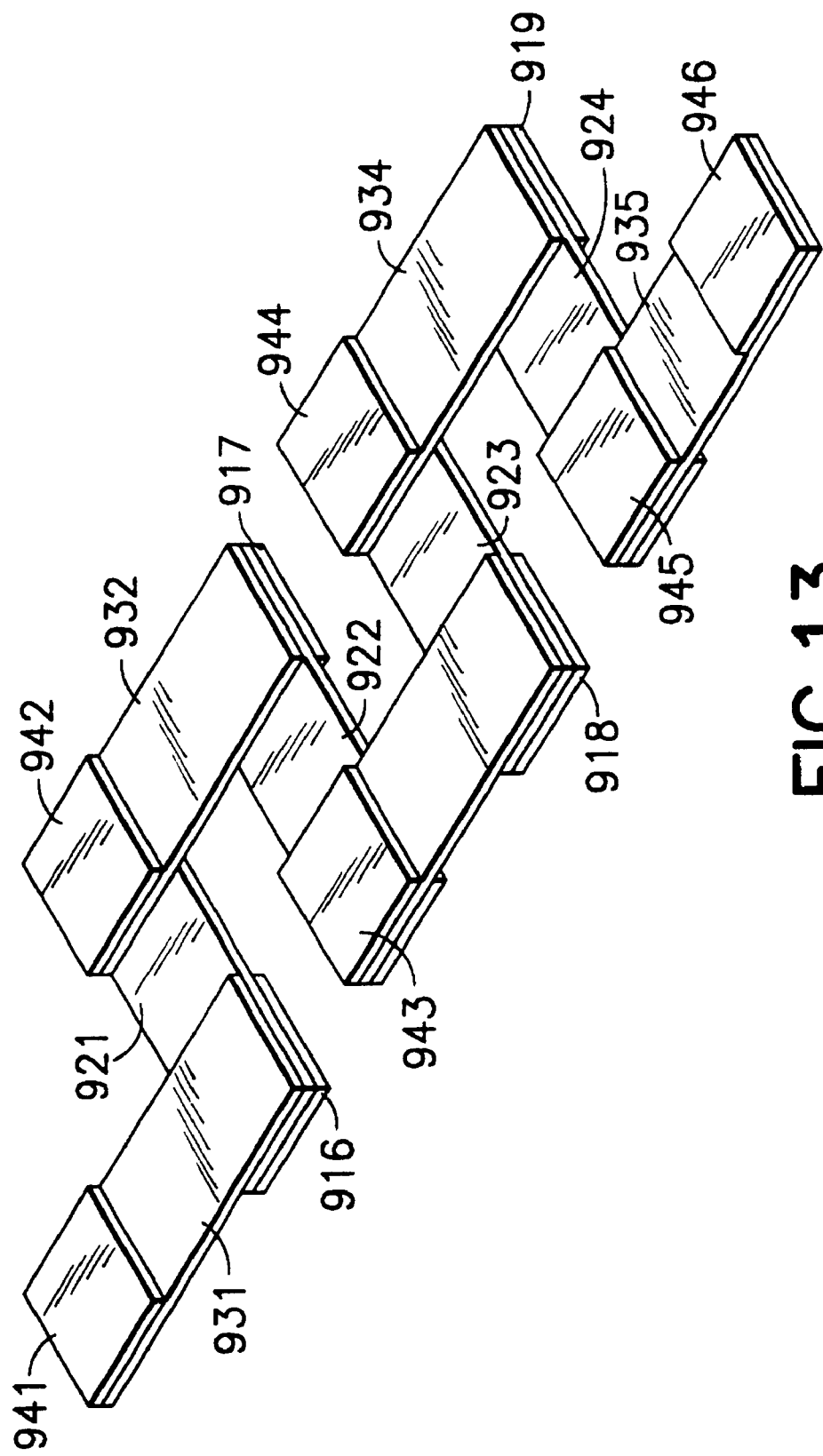

FIG. 13 depicts the completed heat flux sensor of FIG. 7, with copper pads 941, 942, 943, 944, 945 and 946 in a fourth layer. Copper pads 941–946 correspond to pads 740 of FIG. 7. Constructed in the manner, the sensor is effectively imbedded in a solid mass of polymer that is co-planar on one face with the top of these pads, and fills the entire space down to the aluminum substrate 905. Pads 941 and 946 are included to allow electrical connections to be made to the ends of the thermopile on the top surface. The planarity of the sensor gives it a significant advantage in conductive measurements, because it allows good thermal contact with the whole surface.

The difference between this fifth generation sensor (FIGS. 7 and 13) and the second generation sensor (FIG. 4) from which it is derived, is the fourth layer of pads 942, 943, 944, and 945. These pads create additional thermal isolation for the junctions between the second and third layers (depicted in FIGS. 11 and 12) in the form of a layer of photopolymer between those junctions and the top surface of the sensor. This greatly increases the proportion of total temperature difference across the sensor that is transduced into a voltage, nearly tripling its output.

The full benefit of this change is only realized for radiation heat flux measurements, unless an additional layer of thermally conductive material 750 covers the top of the completed thermopile. As previously noted, this layer acts to equalize the temperature on the top surface and thus prevents a buildup of temperature on the polymer portion of the top surface, which would increase the leakage of heat to the lower junctions. Thus, a layer of thermally conductive material such as aluminum or copper is bonded to the top surface of the sensor. With this addition, the response of the sensor to radiation, convection and conduction becomes identical. No other heat flux sensor is known to have this feature.

The thermally conductive layer 750 must be applied in a manner that does not electrically short the copper top pads of the sensor together. An electrically insulating adhesive, applied as a thin film, is used to prevent shorting of the copper top pads.

Although the above-referenced Ormeply ink process has been described for manufacturing the heat flux sensor of the instant invention, it is to be understood that other processes may be used. For example, high volume applications could utilize techniques in which the plastic layers are punched out, bonded together and filled with other types of metallization.

Although the aforementioned preferred embodiment has been shown and described, it is to be understood that the present invention is to be defined only by the claims appended hereto.

What is claimed is:

1. A differential thermopile heat flux sensor, comprising:
   (a) an electrically insulating substrate made of a material which has high thermal conductivity;
   (b) a first layer disposed above said electrically insulating substrate, said first layer comprising (1) insulating material and (2) a plurality of thin raised metal pads covering a part of the surface of said substrate;
   (c) a second layer disposed above said first layer, said second layer comprising (1) insulating material and (2) a plurality of metal links;
   (d) a third layer disposed above said second layer, said third layer comprising (1) insulating material and (2) a plurality of metal links interconnecting said links of said second layer;

(e) a fourth layer disposed above said third layer, said fourth layer comprising (1) insulating material and (2) a plurality of metal pads; and (f) a top layer disposed above said fourth layer made of a thin layer of high thermal conductivity material.

2. The differential thermopile heat flux sensor of claim 1 wherein said links of said second layer each contain a first end and a second end, said first ends disposed in contact with said pads of said first layer.

3. The differential thermopile heat flux sensor of claim 2 wherein said links of said third layer each contain a first end and a second end, said first ends of said third layer disposed in contact with said second ends of said second layer, and said second ends of said third layer disposed in contact with said first ends of said second layer.

4. The differential thermopile heat flux sensor of claim 3 wherein said pads of said fourth layer are disposed in contact with said first ends of said third layer.

5. The differential thermopile heat flux sensor of claim 1 wherein said pads of said first layer and said links of said second layer are made of one metal, and said links of said third layer and said pads of said fourth layer are made of a second metal.

6. The differential thermopile heat flux sensor of claim 5 wherein said first metal is nickel and said second metal is copper.

7. The differential thermopile heat flux sensor of claim 1 wherein said substrate is formed from a metal by coating one of its surfaces with a thin layer of an electrically insulating material.

8. The differential thermopile heat flux sensor of claim 1 wherein said substrate is formed of aluminum and is electrically insulated by an anodic oxidation process.

9. The differential thermopile heat flux sensor of claim 1 wherein said substrate is a flexible sheet.

10. A heat flux sensor comprising:

(a) a flexible aluminum substrate;

(b) a thin layer of an electrically insulating material disposed on at least one side of said flexible aluminum substrate;

(c) a plurality of nickel pads disposed on said flexible aluminum substrate, and polymeric insulating material disposed between said nickel pads;

(d) a plurality of nickel links, each of said nickel links comprising a first end and a second end, and polymeric insulating material disposed between said nickel links, each of said first ends disposed above and in contact with one of said nickel pads;

(e) a plurality of copper links, and polymeric insulating material disposed between said copper links, each of said copper links comprising a first end and a second end, each of said first ends of said copper links disposed above and in contact with a second end of one of said nickel pads, each of said second ends of said copper links disposed above and in contact with a first end of another nickel pad, thereby linking said nickel pads;

(f) a plurality of copper pads, and polymeric insulating material disposed between said copper pads, each of said copper pads disposed above and in contact with a first end of one of said copper pads; and (g) a layer of high thermal conductivity material disposed above and in contact with said plurality of copper pads.

11. A heat flux sensor comprising:

(a) a substrate having a thin layer of an electrically insulating material disposed on at least one side;

(b) a thin layer of high thermal conductivity material spaced apart from said substrate;

(c) a plurality of first metal electrodes disposed between said substrate and said thin layer of high conductivity material;

(d) a plurality of second metal electrodes disposed between said substrate and said thin layer of high conductivity material, each of said second metal electrodes disposed in contact with two of said first metal electrodes, wherein said first metal electrodes are made of a material different from said second metal electrodes;

(e) polymeric insulating material disposed between said plurality of first metal electrodes, said second metal electrodes, said substrate and said thin layer of high conductivity material;

(f) first metal pads, said first metal pads disposed between said substrate and said plurality of first metal electrodes; and (g) second metal pads, said second metal pads disposed between said plurality of second metal electrodes and said thin layer of high conductivity material.

12. The heat flux sensor of claim 11 wherein said plurality of first metal electrodes and said first metal pads are made of the same material.

13. The heat flux sensor of claim 11 wherein said plurality of second metal electrodes and said second metal pads are made of the same material.

14. A heat flux sensor comprising:

(a) substrate means for electrically insulating at least one side of said heat flux sensor;

(b) electrode means for conducting electricity within said heat flux sensor, said electrode means comprising a plurality of hot and cold junctions of electrodes;

(c) polymeric insulating means for insulating said electrode means;

(d) covering means for preventing development of hot locations above the polymeric insulating means;

(e) metallic means for conducting heat from cold junctions of said electrode means to said substrate means; and (f) metallic means for conducting heat to hot junctions of said electrode means from said covering means.

15. The heat flux sensor of claim 14 wherein said substrate means for electrically insulating comprises a flexible substrate having a thin layer of an electrically insulating material disposed on at least one side.

16. The heat flux sensor of claim 14 wherein said electrode means comprises a plurality of first metal electrodes and a plurality of second metal electrodes, each of said second metal electrodes disposed in contact with two of said first metal electrodes, wherein said first metal electrodes are made of a material different from said second metal electrodes.

17. The heat flux sensor of claim 16 wherein said polymeric insulating means comprises polymeric insulating material disposed between said plurality of first metal electrodes, said second metal electrodes, said substrate means and said means thin layer of high conductivity material.

18. The heat flux sensor of claim 14 wherein said covering means is a thin layer of high conductivity material.

19. The heat flux sensor of claim 14 wherein said metallic means for conducting heat from cold junctions of said electrode means to said substrate means comprises a plurality of metal pads.

20. The heat flux sensor of claim 14 wherein said metallic means for conducting heat to hot junctions of said electrode means from said covering means comprises a plurality of metal pads.

21. A differential thermopile heat flux sensor, comprising:
(a) an electrically insulating substrate made of a material which has high thermal conductivity;
(b) a first layer disposed above said electrically insulating substrate, said first layer comprising (1) a plurality of first metal bridges made of a first metal and (2) insulating material disposed between said plurality of first metal bridges;
(c) a second layer disposed above said first layer, said second layer comprising (1) a plurality of first metal links made of said first metal, (2) a plurality of second metal links made of a second metal and (3) insulating material disposed between said plurality of first metal links and said second metal links; and
(d) a third layer disposed above said second layer, said third layer comprising (1) a plurality of second metal bridges made of said second metal and (2) insulating material disposed between said said plurality of second metal bridges;
wherein each of said first metal bridges is in contact with one of said first metal links and one of said second metal links, and wherein each of said second metal bridges is in contact with one of said first metal links and one of said second metal links.

22. The differential thermopile heat flux sensor of claim 21 further comprising:
(e) a top layer disposed above said third layer made of a thin layer of high thermal conductivity material.

23. The differential thermopile heat flux sensor of claim 21 wherein said first metal is nickel.

24. The differential thermopile heat flux sensor of claim 21 wherein said second metal is copper.

* * * * *